US009161475B2

(12) United States Patent
Ng et al.

(10) Patent No.: US 9,161,475 B2
(45) Date of Patent: Oct. 13, 2015

(54) MULTI-FUNCTION MODULE FOR INSERTION INTO A NETWORKING CHASSIS SLOT

(71) Applicant: HEWLETT-PACKARD DEVELOPMENT COMPANY, L.P., Houston, TX (US)

(72) Inventors: Kay Seah Ng, Singapore (SG); Chadi Farid Theodossy, Rocklin, CA (US); Irving M. Birmingham, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 442 days.

(21) Appl. No.: 13/664,849

(22) Filed: Oct. 31, 2012

(65) Prior Publication Data

US 2014/0118920 A1    May 1, 2014

(51) Int. Cl.
H05K 7/02        (2006.01)
H05K 7/14        (2006.01)
G06F 1/20        (2006.01)
G06F 1/18        (2006.01)

(52) U.S. Cl.
CPC .............. *H05K 7/1487* (2013.01); *G06F 1/185* (2013.01); *G06F 1/20* (2013.01); *Y10T 29/49002* (2015.01)

(58) Field of Classification Search
USPC ........................ 361/676–678, 679.46–679.54, 361/688–723, 752, 760, 781–785, 790–796, 361/807, 810, 828–829, 831
See application file for complete search history.

(56) References Cited

U.S. PATENT DOCUMENTS

| | | | |
|---|---|---|---|
| 5,737,194 A * | 4/1998 | Hopkins et al. | 361/800 |
| 6,241,562 B1 * | 6/2001 | Benda et al. | 439/731 |
| 7,453,706 B2 * | 11/2008 | Clark et al. | 361/796 |
| 8,681,501 B2 * | 3/2014 | Govindasamy et al. | 361/710 |
| 2006/0221559 A1 * | 10/2006 | Campini et al. | 361/679 |
| 2009/0097200 A1 | 4/2009 | Sharma et al. | |
| 2009/0244831 A1 * | 10/2009 | Nemoz et al. | 361/679.48 |
| 2009/0251867 A1 * | 10/2009 | Sharma et al. | 361/737 |

OTHER PUBLICATIONS

CommScope Enterprise Data Center Design Guide, Aug. 18, 2011. <http://docs.commscope.com/Public/Data_Center_Design_Guide.pdf>.
TST 1U Blade B102PT for Intel S3000pt HPC Board, Mar. 17, 2012. <http://www.intel.com/Assets/PDF/general/b102.pdf>.

\* cited by examiner

*Primary Examiner* — Courtney Smith
(74) *Attorney, Agent, or Firm* — Mannava & Kang, P.C.

(57) ABSTRACT

According to an example, a multi-function module for insertion into a slot of a networking chassis includes a front plane having an opening through which a plurality of ports are accessible, a switch carrier board comprising an ASIC that is to operate as an interface between the plurality of ports accessible through the front plane and a plurality of rear connectors, and a microprocessor system board positioned in spaced relation with respect to the switch carrier board, the microprocessor system board comprising a microprocessor, a chipset, and a memory. The ASIC is positioned on a side of the switch carrier board that faces the microprocessor board and the microprocessor is positioned on a side of the microprocessor system board that faces the switch carrier board.

15 Claims, 4 Drawing Sheets

MULTI-FUNCTION MODULE FOR INSERTION INTO A NETWORKING CHASSIS SLOT

BACKGROUND

Network switches are hardware-based devices that control the flow of data packets or cells based upon destination address information available in each packet. In environments where relatively large amounts of data switching are needed, multiple network switches are combined into a switch assembly housed in a chassis. Generally speaking, a chassis is a frame or box containing multiple ports into which the multiple network switches, which are typically referred to as modules or blades, are inserted and supported. The chassis typically provides cooling and power resources that are shared among the network switches.

BRIEF DESCRIPTION OF THE DRAWINGS

Elements of the present disclosure are illustrated by way of example and not limited in the following figure(s), in which like numerals indicate like elements, in which.

DETAILED DESCRIPTION

Figure 1:
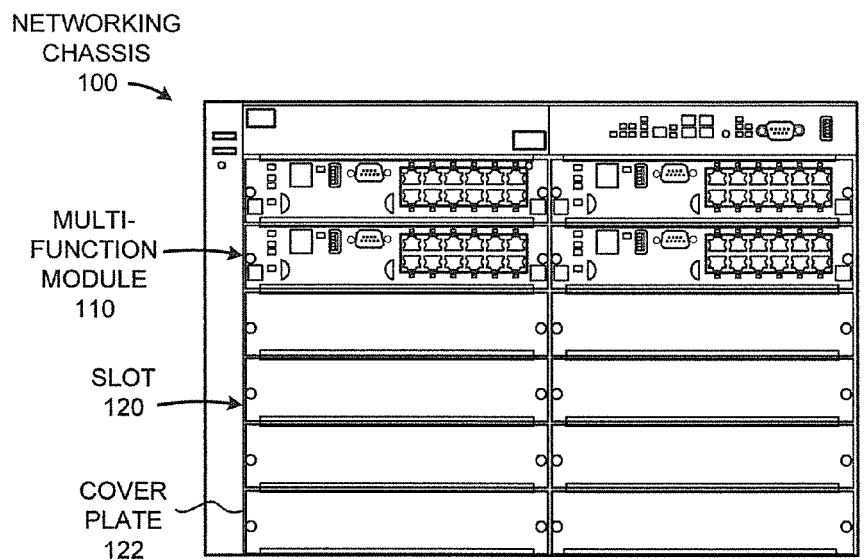
FIG. 1 shows a front elevation view of a networking chassis, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Disclosed herein are example multi-function modules (e.g., network switch modules) for insertion into a slot of a networking chassis and a method for fabricating the multi-function module. The example multi-function modules include a front plane having an opening through which a plurality of ports, e.g., Ethernet ports, are accessible, a switch carrier board comprising an application specific integrated circuit (ASIC) that is to operate as an interface between the plurality of ports and a plurality of rear connectors, and a microprocessor system board positioned in spaced relation with respect to the switch carrier board, the microprocessor system board comprising a microprocessor, a chipset, and a memory. In the example multi-function modules, the ASIC is positioned on a side of the switch carrier board that faces the microprocessor board and the microprocessor is positioned on a side of the microprocessor system board that faces the switch carrier board. According to an example, the example multi-function modules also include a mezzanine I/O board that is customizable to perform various functions in the multi-function module.

As discussed in greater detail herein below, the example multi-function modules have relatively small form factors and thus, the components of the switch carrier board, the mezzanine I/O board, and the microprocessor system board are maintained in relatively close proximities to each other. In other words, there is a relatively small amount of space between the switch carrier board and the microprocessor system board. By way of example, the multi-function module has a form factor that is less than approximately 9.5 inches in width, less than approximately 2 inches in height, and less than approximately 20 inches in depth. In this example, the multi-function module disclosed herein is to be inserted into a slot of a networking chassis that is sized to fit within a standard EIA electronics cabinet. Thus, for instance, the multi-function module disclosed herein may comprise a 1U height and a half-width form factor.

As also discussed herein below, the example multi-function modules disclosed herein include a plurality of cooling mechanisms to facilitate dissipation of heat from heat generating components of the switch carrier board, the microprocessor system board, and the mezzanine I/O board. The example multi-function modules also include a heat sink that is thermally connected to the microprocessor of the microprocessor system board and positioned between the microprocessor system board and the switch carrier board in a manner that substantially limits the flow of airflow heated in the heat sink from substantially flowing over other heat generating components of the microprocessor system board.

In one regard, the example multi-function modules disclosed herein provide the functionality of a network switch and a server in a substantially smaller space and with much less cabling than in implementations that include a separate network switch and server. In addition, the example multi-function modules disclosed herein enable users to modularly upgrade their networking switches by adding multi-function modules as increased switching ability is desired. In other words, users may implement the multi-function module disclosed herein instead of having to install separate modules for network switching and management functions.

With reference first to FIG. 1, there is shown a front elevation view of a networking chassis 100, according to an example. It should be understood that the networking chassis 100 depicted in FIG. 1 may include additional components and that some of the components described herein may be removed and/or modified without departing from a scope of the networking chassis 100. It should also be understood that the components depicted in FIG. 1 are not drawn to scale and thus, the components may have different relative sizes with respect to each other than as shown therein.

According to an example, the networking chassis 100 comprises a frame having dimensions that enable the networking chassis 100 to be mounted within an Electronic Industries Alliance (EIA) standard rack/equipment cabinet and/or a two column networking rack. In this example, the networking chassis 100 comprises a width that is less than 19 inches and a depth that is less than 24 inches. By way of particular example, the networking chassis 100 comprises a networking chassis available from the Hewlett Packard Company™, such as the HP 5400 and the HP 8200 Switch Series™.

The networking chassis 100 is depicted as including a plurality of slots 120 into which modules are to be inserted. Although the networking chassis 100 has been depicted as including 12 slots, it should be understood that the networking chassis 100 may include a lesser or a greater number of slots without departing from features of the present disclosure. In addition, each of the slots 120 may comprise a standard 1U height, i.e., 1.75 inches, and the networking chassis 100 may comprise a 6U or a 7U height.

The modules that are to be inserted into the networking chassis 100 may comprise modules that are to perform various types of functions. The modules may comprise modules that are to perform one type of function including a network switching function, a management function, etc. According to an example, and as discussed in greater detail herein, multi-function modules 110, i.e., modules that perform network switching functions, management functions, as well as other functions, may also or alternatively be inserted into the slots 120 of the networking chassis 100. According to a particular example, the multi-function modules 110 comprise network switches having additional functionality, such as data management functions, security functions, etc. Four multi-function modules 110 have been depicted as being inserted into four slots 120 of the networking chassis 100 for purposes of illustration. In addition, the empty slots 120 have been depicted as being covered by respective cover plates 122.

Although not shown, the networking chassis 100 includes various other components that provide power to the modules as well as cooling components, e.g., fans, blowers, refrigeration systems, etc., to dissipate heat generated in the modules. In addition, the networking chassis 100 comprises a plurality of openings in the side walls to enable airflow to pass through the modules. By way of particular example, the modules, including the multi-function module 110, are designed to support 75 watts of power and the cooling components of the networking chassis 100 are to dissipate that amount of heat from the modules. In addition, the multi-function module 110 may not include fans or other active cooling mechanisms because the multi-function module 110 may sufficiently be cooled to operate within a predetermined range of temperatures by operation of the fans in the networking chassis 100. In other examples, however, the multi-function module 110 may include a fan or other cooling mechanism to further enhance cooling of a component within the multi-function module 110.

Figure 2:
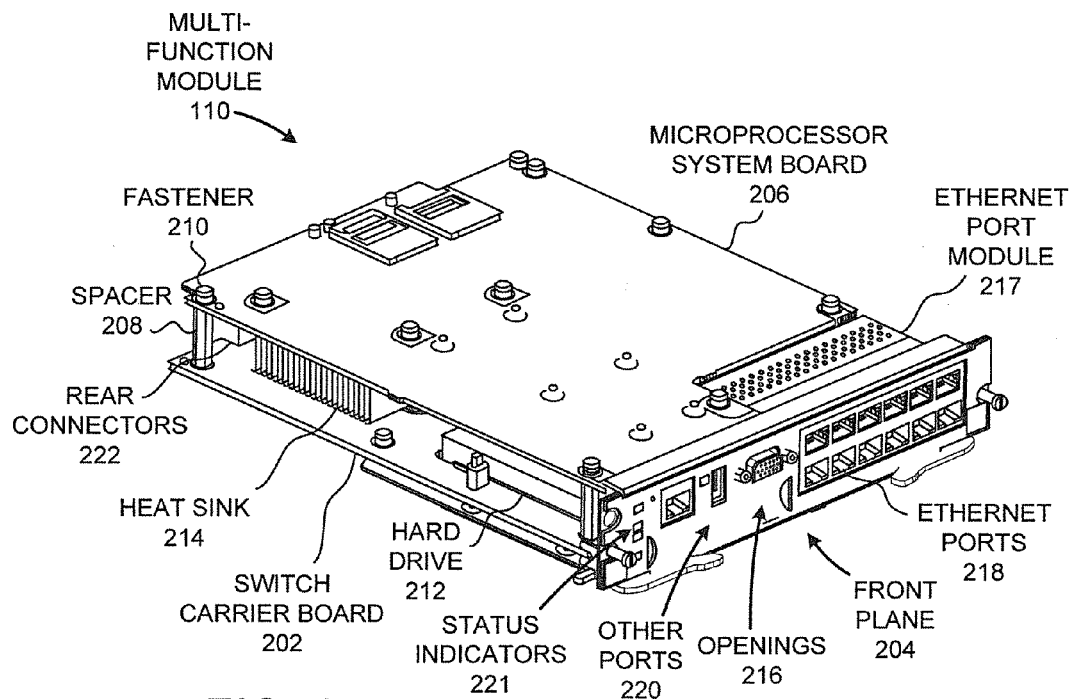
FIG. 2 shows a perspective view of a multi-function module, according to an example of the present disclosure.

Turning now to FIG. 2, there is shown a perspective view of a multi-function module 110, according to an example. It should be understood that the multi-function module 110 depicted in FIG. 1 may include additional components and that some of the components described herein may be removed and/or modified without departing from a scope of the multi-function module 110.

As shown in FIG. 2, the multi-function module 110 includes a switch carrier board 202, a front plane 204, a microprocessor system board 206, and an Ethernet port module 217. The microprocessor system board 206 is depicted as being positioned in spaced relation with respect to and in substantial alignment with the switch carrier board 202 by a plurality of spacers 208 and fasteners 210. As shown, the microprocessor system board 206 and the switch carrier board 202 have approximately the same dimensions and are vertically aligned with respect to each other. In addition, the microprocessor system board 206 is depicted as extending in a substantially parallel manner with the switch carrier board 202. The multi-function module 110 may also include a mezzanine input/output (I/O) board 302 (FIG. 3) positioned between the switch carrier board 202 and the microprocessor system board 206. The switch carrier board 202, the microprocessor system board 206, and the mezzanine I/O board 302 may comprise respective printed circuit boards (PCBs) on which are mounted a plurality of electrical components as discussed in greater detail herein below.

The multi-function module 110 is also depicted as including a hard drive 212 and a heat sink 214 positioned substantially between the switch carrier board 202 and the microprocessor system board 206. The hard drive 212 may have stored thereon a set of machine readable instructions that enable the booting of the multi-function module 110 and may also provide storage of application data for the multi-function module 110. As discussed in greater detail below, the hard drive 212 and the heat sink 214 are arranged within the multi-function module 110 to accommodate the components of the switch carrier board 202, the microprocessor system board 206, and the mezzanine I/O board 302, while still enabling adequate airflow between the boards 202, 206, and 302 to sufficiently cool the components of the switch carrier board 202, the microprocessor system board 206, and the mezzanine I/O board 302.

The front plane 204 is depicted as having a number of openings 216 through which a number of Ethernet ports 218 of the Ethernet port module 217 are accessible. A plurality of other ports 220, such as a universal serial bus port, a Video Graphics Array (VGA) port, an Ethernet port, etc., are also depicted as being accessible through openings 216 in the front plane 202. Status indicators 221, such as light emitting diodes, which may visually indicate a status of the multi-function module 110, such as power, connectivity, etc., are further depicted as being shown through the openings 216 in the front plane 202. As discussed in greater detail below, the Ethernet port module 217 is wired to chips on the switch carrier board 202. In addition, the other ports 220 and the status indicators 221 are wired to a chipset on the microprocessor system board 206.

The multi-function module 110 is also depicted as including a plurality of rear connectors 222 that are to be connected to a switch fabric (not shown) are accessible. As discussed below, the switch carrier board 202 includes components that enables the Ethernet ports 218 to be interfaced with the rear connectors 222, which are to connect to the switch fabric.

According to an example, the multi-function module 110 has a form factor in which the width dimension is less than about half of the width of an EIA standard rack/equipment cabinet and has approximately a 1U height. In this example, the width of the multi-function module 110 is less than about 9.5 inches. In addition, the height of the multi-function module 110 is less than about 2 inches and the depth of the multi-function module 110 is less than approximately 10 inches. By way of particular example, the multi-function module 110 is approximately 8 inches in width, approximately 1.75 inches in height, and less than approximately 10 inches in depth.

Figure 3:
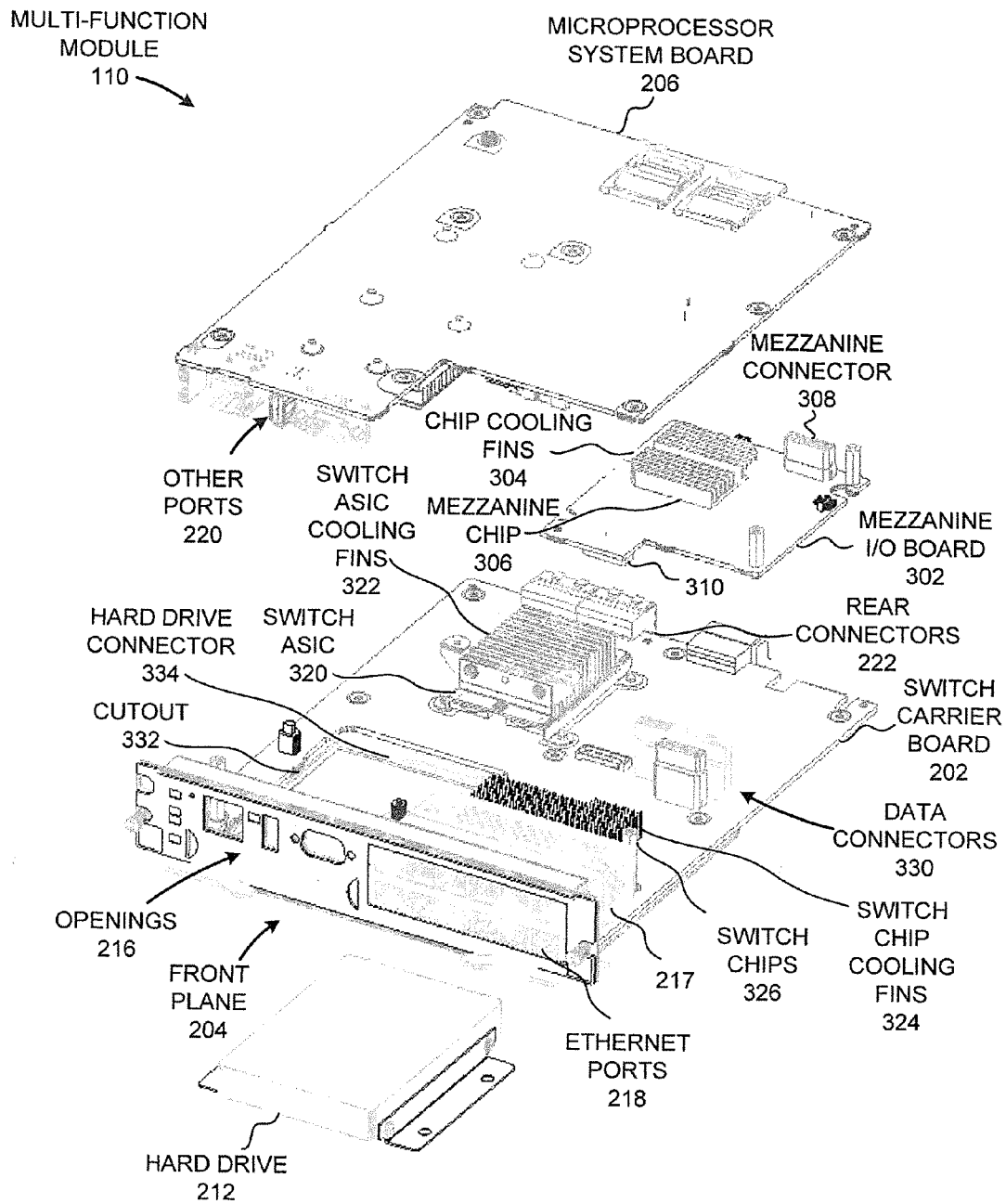
FIG. 3 shows a partially exploded, perspective view, shown from the top, of the multi-function module depicted in FIG. 2, according examples of the present disclosure.

Turning now to FIG. 3, there is shown a partially exploded, perspective view, shown from the top, of the multi-function module 110 depicted in FIG. 2, according to an example. As shown in FIG. 3, the multi-function node 110 comprises a mezzanine input/output (I/O) board 302. The mezzanine I/O board 302 is depicted as including mezzanine chip cooling fins 304, under which is a mezzanine chip 306. The mezzanine I/O board 302 also includes a pair of mezzanine connectors 308, 310 that are to interface with respective mating connectors on the switch carrier board 202 and the microprocessor system board 206.

In FIG. 3, the components of the switch carrier board 202 are depicted in greater detail. Particularly, the switch carrier board 202 is depicted as including a switch application specific integrated circuit (ASIC) 320 and a plurality of switch ASIC cooling fins 322 attached to the switch ASIC 320. The switch ASIC 320 is to operate as an interface between the Ethernet ports 218 on the front plane 204 and the switch fabric, for instance, through the rear connectors 222. Thus, for instance, the switch ASIC 320 may perform switching functions on packets of data communicated between the Ethernet ports 218 and the rear connectors 222. By way of example, the switch ASIC 320 may determine which of the Ethernet ports 218 packets of data received through the rear connectors 222 are to be communicated based upon destination addresses contained in the packets of data and vice versa. In addition, the ASIC fins 322 are to facilitate dissipation of heat generated by the switch ASIC 320 by providing a relatively large surface area over which heat may be transferred to cooling airflow supplied over the ASIC fins 322.

The switch carrier board 202 is also depicted as including switch chip cooling fins 324 positioned on top of a plurality of switch chips 326. The switch chips 326 generally are to drive the Ethernet ports 218 and thus may comprise any suitable types of switch chips to perform this function. In addition, the switch chip cooling fins 324 are to facilitate dissipation of heat generated by the switch chips 326. In the example shown in FIG. 3, the switch carrier board 202 includes three switch chips 326, and each of the switch chips 326 is to drive four of the Ethernet ports 218. According to a particular example, each of the Ethernet ports 218 comprises a Gigabit Ethernet port. In other examples, the Ethernet ports 218 comprise other types of Ethernet ports, including a combination of different types of Ethernet ports.

The switch carrier board 202 is further depicted as including a plurality of data connectors 330 that are to mate with matching data connectors on the mezzanine I/O board 302 and on the microprocessor system board 206. According to an example, data may be communicated among the components in the switch carrier board 202, the microprocessor system board 206, and the mezzanine I/O board 302.

The switch carrier board 202 is still further depicted as including a cutout 332 into which the hard drive 212 is to be inserted. According to an example, the hard drive 212 comprises a relatively large capacity hard drive having a substantially greater height as compared with conventional hard drives typically employed in networking switch blades. By way of example, the hard drive 212 may have a height of around 15 mm. The hard drive 212 may be electrically connected to the switch carrier board 202 through a hard drive connector 334.

Figure 4:
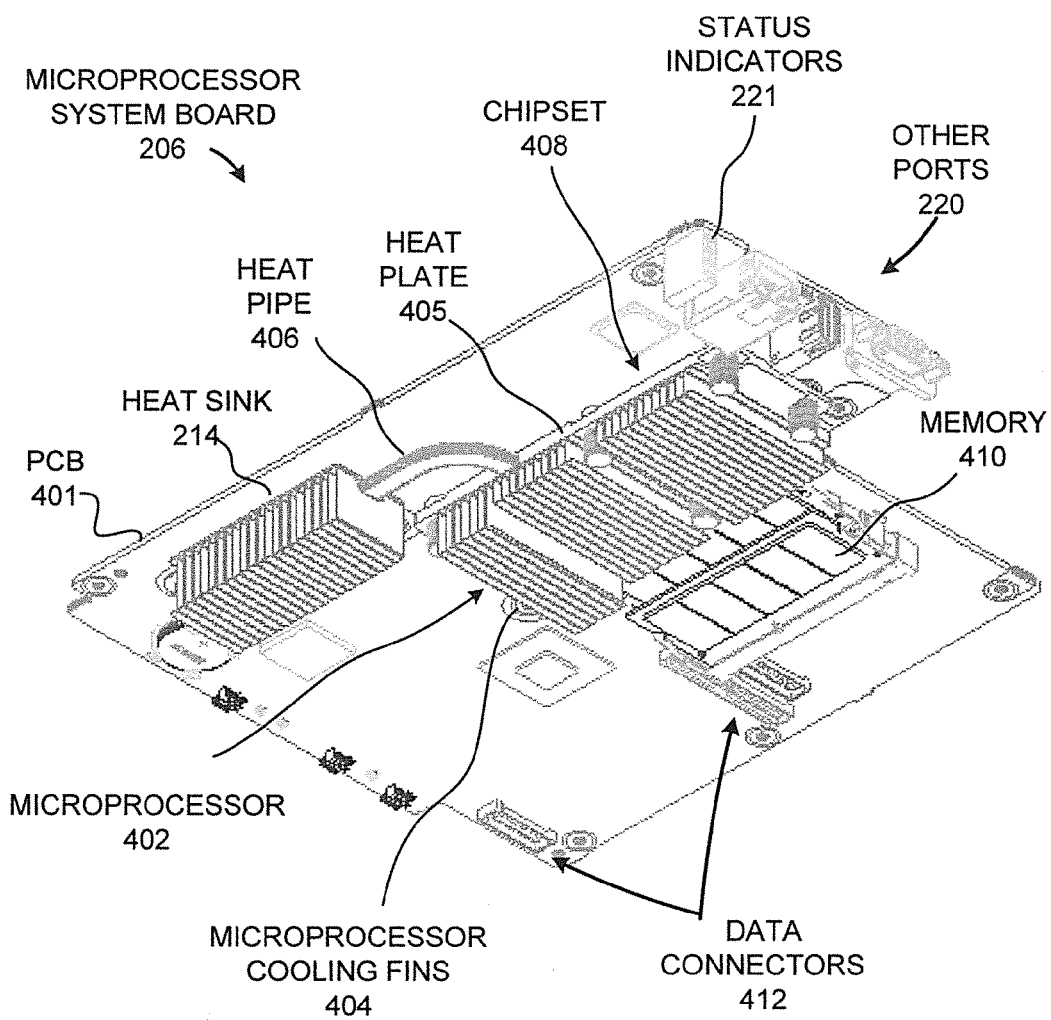
FIG. 4 shows a perspective view, viewed from the top, of the microprocessor system board depicted in FIG. 3 with the printed circuit board (PCB) of the microprocessor system board shown transparently, according to an example of the present disclosure.

Turning now to FIG. 4, there is shown a perspective view, viewed from the bottom, of the microprocessor system board 206 having a printed circuit board (PCB) 401, according to an example. As shown in FIG. 4, the microprocessor system board 206 includes a microprocessor 402, which may comprise a CPU that is to operate under the x86 instruction set architecture. Although not shown in FIG. 4, it should be understood that the microprocessor 402 is positioned between the PCB 401 and the microprocessor cooling fins 404. The microprocessor 402 may perform various management functions in the multi-function module 110, such as security/encryption/decryption, deep packet inspection, forwarding of network packets, handling of control plane traffic, etc. As also shown in FIG. 4, microprocessor cooling fins 404 are in thermal connection with the microprocessor 402 and are to facilitate dissipation of heat generated in the microprocessor 402.

Heat generated in the microprocessor 402 may additionally be dissipated through the heat sink 214, which may be attached to the microprocessor system board 206 at a location that provides sufficient space for the switch ASIC 320 and the switch ASIC cooling fins 322 to be positioned on the switch carrier board 202 without substantial obstruction. In addition, the heat sink 214 may be positioned at a location that is not directly upstream (directly to the left of the microprocessor 402 as shown in FIG. 4) of the switch chips 326 and the switch chip cooling fins 324, which may be positioned downstream (to the right of the microprocessor 402 in FIG. 4). The heat sink 214 may be positioned in this manner to substantially limit the flow of air heated in the heat sink 214 from flowing through the switch chips 326 and the switch chip cooling fins 324.

Heat from the microprocessor 402 may be transferred from the microprocessor 402 to the heat sink 214 through a heat pipe 406. According to an example, the heat pipe 406 comprises a hollow and enclosed tube, in which the interior of the heat pipe 406 is maintained at a substantially low pressure. Inside the hollow tube is a fluid that is to vaporize when the fluid reaches a predetermined temperature to thereby transfer heat from a component to which a first end of the heat pipe 406 is in thermal contact. The heat pipe 406 is also in thermal contact with the heat sink 214 at a second end thereof and heat is to be conducted from the vaporized fluid to the fins of the heat sink 214, thereby causing the vaporized fluid to condense. The condensed fluid may return from the second end to the first end through capillary action and/or gravity action. In some examples, the hollow tube includes a wick that facilitates the transfer of the condensed liquid from the second end to the first end.

As shown in FIG. 4, the first end of the heat pipe 406 is in thermal contact with the microprocessor 402 or a heat plate 405 positioned on the microprocessor 402. In addition, the second end of the heat pipe 406 is positioned in thermal contact with a base of the heat sink 214, such that heat released from the vapor condensing back into a liquid is substantially dissipated through the cooling fins of the heat sink 214. As shown in FIG. 4, the microprocessor 402 is positioned on the microprocessor system board 206 at a location that enables sufficient space to be provided beneath the microprocessor cooling fins 404 for the hard drive 212 to fit beneath the microprocessor cooling fins 404. As also shown, portions of the microprocessor cooling fins 404 are relatively taller than other portions of the microprocessor cooling fins 404 to accommodate the hard drive 212 and to substantially maximize heat dissipation.

The microprocessor system board 206 is further depicted as including a chipset 408 and a memory 410. Although not shown in FIG. 4, it should be understood that the chipset 408 is positioned between the PCB 401 and the microprocessor cooling fins 404. The heat plate 405 is depicted as being positioned on the chipset 408 to thus enable the microprocessor cooling fins 404 and the heat plate 405 to facilitate dissipation of heat generated in the chipset 408. The chipset 408 may comprise, for instance, a ball grid array ASIC that is to facilitate communications between the microprocessor 402 and various external devices. The microprocessor 402 may be integrated into the chipset 408 or the microprocessor 402 may comprise a separate component from the chipset 408. In any regard, the chipset 408 may comprise any suitable type of chipset. In addition, the other ports 220 and the status indicators 221 may be in electrical communication with the chipset 408.

As shown in FIG. 4, the memory 410 comprises a pair of laterally arranged small outline dual in-line memory modules (DIMMs). In any regard, by laterally arranging the memory modules of the memory 410, additional space may be created inside of the multi-function module 110 and without substantially impeding airflow through the multi-function module 110. In addition, the memory 410 may comprise any reasonably suitable type of memory module(s).

As still further shown in FIG. 4, the microprocessor system board 206 includes microprocessor system board data connectors 412 that are to mate with the data connectors 308 and 330 respectively provided on the mezzanine I/O board 302 and the switch carrier board 202. According to an example, the mezzanine I/O board 302 is to operate as a mobility tunneling board for the switch ASIC 320 and the microprocessor 402. In another example, the mezzanine I/O board 302 is to operate as a network interface card between the microprocessor 402 and the switching fabric, i.e., to provide 10 gigabit connections between the microprocessor 402 and the switching fabric. In a further example, the mezzanine I/O board 302 is to operate as an encryption based card that is to, for instance, offload encryption processes from the microprocessor 402. In other examples, the mezzanine I/O board 302 is customizable and/or replaceable with other mezzanine I/O boards 302 to perform any of the functions discussed above or other various other functions.

Figure 5:
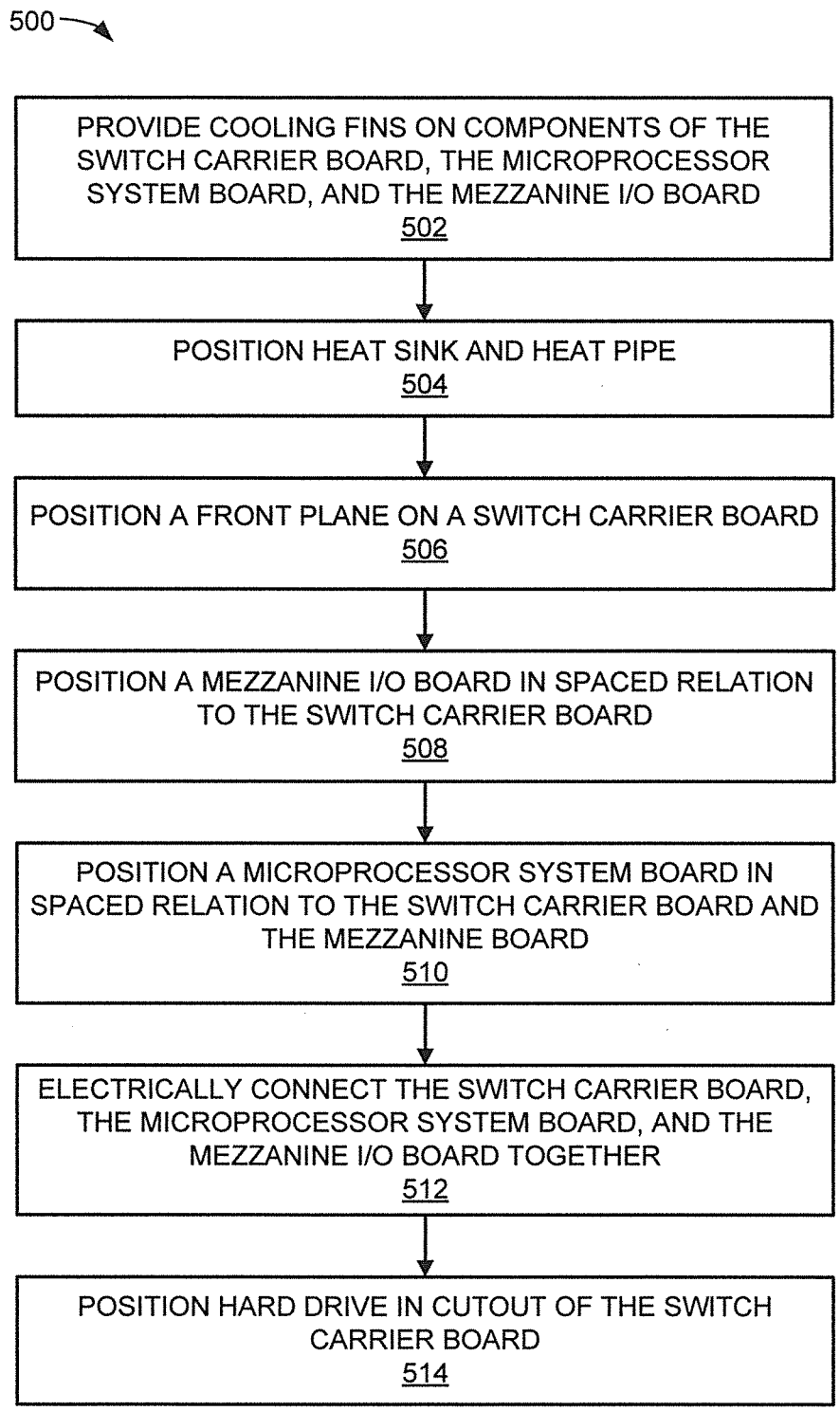
FIG. 5 shows a flow diagram of a method for fabricating a multi-function module, such as the multi-function module depicted in FIG. 2, according to an example of the present disclosure.

Turning now to FIG. 5, there is shown a flow diagram of a method 500 for fabricating a multi-function module 110 for insertion into a slot of a networking chassis 100, according to an example. It should be understood that the method 500 may include additional processes and that some of the processes described herein may be removed and/or modified without departing from a scope of the method 500. The order in which the processes are performed in the method 500 may also be modified.

At block 502, a plurality of cooling fins 304, 322, 324, and 404 are provided on respective components of the switch carrier board 202, the microprocessor system board 206, and the mezzanine I/O board 302 to facilitate dissipation of heat from the components (i.e., mezzanine chip 306, switch ASIC 320, switch chips 326, microprocessor 402, and the chipset 408).

At block 504, a heat sink 214 is positioned in spaced relation with respect to the microprocessor 402 and a heat pipe 406 is positioned to conduct heat from the microprocessor 402 to the heat sink 214. Particularly, the heat sink 214 is attached to the microprocessor system board 206 and the heat pipe 406 may be attached to the heat sink 214 and the microprocessor 402 as discussed above.

At block 506, a front plane 204 is positioned on a switch carrier board 202 such that a plurality of Ethernet ports 218 are accessible through an opening 216 in the front plane 204. The switch carrier board 202 includes an ASIC 320 that is to operate as an interface between the plurality of Ethernet ports 218 on the front plane and a plurality of rear connectors 222.

At block 508, a mezzanine input/output (I/O) board 302 is positioned in spaced relation with respect to the switch carrier board 202. As shown in FIG. 3, and according to an example, the mezzanine I/O board 302 is positioned substantially in the back right corner of the switch carrier board 202.

At block 510, a microprocessor system board 206 is positioned in spaced relation with respect to and in substantial alignment with the switch carrier board 202 while maintaining the mezzanine I/O board 302 between the microprocessor system board 206 and the switch carrier board 202. The microprocessor system board 206 includes a microprocessor 402, a chipset 408, and a memory 410 facing the switch carrier board 202.

At block 512, the switch carrier board 202, the microprocessor system board 206, and the mezzanine I/O board 302 are electrically connected to each other through a plurality of respective connectors 308, 310, 330, and 412. According to an example, the switch carrier board 202, the microprocessor system board 206, and the mezzanine I/O board 302 are electrically connected together during blocks 504 and 506.

At block 514, a hard drive 212 is positioned into a cutout in the switch carrier board 202 such that a portion of the hard disk 212 extends above a plane of the PCB of the switch carrier board 202.

Although not explicitly discussed above, positioning of the switch carrier board 202, the microprocessor system board 206, and the mezzanine I/O board 302 with respect to each other may include fastening the switch carrier board 202, the microprocessor system board 206, and the mezzanine I/O board 302 to each other through use of spacers 208 and fasteners 210. The components of the switch carrier board 202, the microprocessor system board 206, and the mezzanine I/O board 302 may be attached to their respective PCBs through any suitable fastening mechanisms, such as fasteners, adhesives, etc. In addition, the cooling fins 304, 322, 324, and 404 may be attached to respective heat generating components through use of thermally conductive adhesives, or otherwise maintained in thermal contact with their respective heat generating components.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A multi-function module for insertion into a slot of a networking chassis, said module comprising:
   a front plane having an opening through which a plurality of ports are accessible;
   a switch carrier board comprising an application specific integrated circuit (ASIC) that is to operate as an interface between the plurality of ports accessible through the front plane and a plurality of rear connectors;
   a microprocessor system board positioned in spaced relation with respect to the switch carrier board, said microprocessor system board comprising a microprocessor, a chipset, and a memory; and
   wherein the ASIC is positioned on a side of the switch carrier board that faces the microprocessor board and wherein the microprocessor is positioned on a side of the microprocessor system board that faces the switch carrier board.

2. The multi-function module according to claim 1, further comprising:
   a mezzanine input/output (I/O) board positioned between the switch carrier board and the microprocessor, wherein the mezzanine I/O board provides connectivity between the ASIC and the microprocessor, and wherein the microprocessor is to perform management functions.

3. The multi-function module according to claim 1, further comprising:
a hard drive; and
wherein the switch carrier board comprises a cutout into which the hard drive is inserted.

4. The multi-function module according to claim 1, wherein a form factor of the multi-function module comprises a width dimension that is less than approximately 9.5 inches, a height dimension that is less than approximately two inches, and a depth dimension that is less than approximately 20 inches.

5. The multi-function module according to claim 1, wherein a form factor of the multi-function module comprises a width dimension that is approximately eight inches, a height dimension that is approximately 1.75 inches, and a depth dimension that is less than approximately 10 inches.

6. The multi-function module according to claim 1, wherein the switch carrier board further comprises a plurality of switch chips to drive the plurality of ports and a plurality of cooling fins positioned to facilitate dissipation of heat generated by the ASIC, the microprocessor, and the plurality of chips.

7. The multi-function module according to claim 1, further comprising:
microprocessor cooling fins positioned to facilitate dissipation of heat from the microprocessor;
a heat sink positioned in spaced relation with respect to the microprocessor; and
a heat pipe having a first end to collect heat from the microprocessor and a second end to conduct heat to the heat sink.

8. The multi-function module according to claim 7, wherein the microprocessor cooling fins are connected to a heat plate and wherein the heat plate is in thermal contact with the microprocessor and the chipset, and wherein the first end of the heat pipe is in thermal contact with the heat plate.

9. A network switch module for insertion into a slot of a networking chassis, said network switch comprising:
a front plane having an opening through which a plurality of Ethernet ports are accessible;
a switch carrier board comprising an application specific integrated circuit (ASIC) that is to operate as an interface between the plurality of Ethernet ports and a plurality of rear connectors;
a microprocessor system board positioned in spaced relation with respect to and in substantial alignment with the switch carrier board, said microprocessor system board comprising a microprocessor, a chipset, and a memory; and
a mezzanine input/output (I/O) board positioned between the switch carrier board and the microprocessor, wherein the mezzanine I/O board is electrically connected to the switch carrier board and the microprocessor system board.

10. The network switch module according to claim 9, wherein the ASIC is positioned on a side of the switch carrier board that faces the microprocessor board and wherein the microprocessor is positioned on a side of the microprocessor system board that faces the switch carrier board.

11. The network switch module according to claim 9, wherein a form factor of the multi-function module comprises a width dimension that is less than approximately 9.5 inches, a height dimension that is less than approximately two inches, and a depth dimension that is less than approximately 20 inches.

12. The network switch module according to claim 9, further comprising:
a hard drive; and
wherein the switch carrier board comprises a cutout into which the hard drive is inserted.

13. The network switch module according to claim 9, wherein the switch carrier board further comprises a plurality of switch chips to drive the plurality of ports, said network switch module further comprising:
a plurality of cooling fins positioned to facilitate dissipation of heat generated by the ASIC and the plurality of chips;
microprocessor cooling fins positioned to facilitate dissipation of heat from the microprocessor;
a heat sink positioned in spaced relation with respect to the microprocessor; and
a heat pipe having a first end to collect heat from the microprocessor and a second end to conduct heat to the heat sink.

14. A method for fabricating a multi-function module for insertion into a slot of a networking chassis, said method comprising:
positioning a front plane on a switch carrier board, said switch carrier board having a plurality of Ethernet ports that are accessible through an opening in the front plane, said switch carrier board also including an application specific integrated circuit (ASIC) that is to operate as an interface between the plurality of Ethernet ports and a plurality of rear connectors;
positioning a mezzanine input/output (I/O) board in spaced relation with respect to the switch carrier board;
positioning a microprocessor system board in spaced relation with respect to and in substantial alignment with the switch carrier board while maintaining the mezzanine I/O board between the microprocessor system board and the switch carrier board, said microprocessor system board comprising a microprocessor, a chipset, and a memory facing the switch carrier board;
electrically connecting the switch carrier board, the microprocessor system board, and the mezzanine I/O board together through a plurality of respective connectors; and
providing a plurality of cooling fins on respective components of the switch carrier board, the microprocessor system board, and the mezzanine I/O board to facilitate dissipation of heat from the components.

15. The method according to claim 14, wherein the switch carrier board comprises a cutout, said method further comprising:
positioning a hard drive into the cutout such that a portion of the hard disk extends above a plane of the switch carrier board;
positioning a heat sink in spaced relation with respect to the microprocessor; and
positioning a heat pipe to conduct heat from the microprocessor to the heat sink.

* * * * *